United States Patent [19]

Gordon et al.

[11] 4,331,253

[45] May 25, 1982

[54] LID ASSEMBLY FOR HERMETIC SEALING OF A SEMICONDUCTOR CHIP

[75] Inventors: Richard Gordon, Scarsdale; John G. Ciallella, White Plains, both of N.Y.

[73] Assignee: Consolidated Refining Co., Inc., Mamaroneck, N.Y.

[21] Appl. No.: 243,389

[22] Filed: Mar. 13, 1981

Related U.S. Application Data

[63] Continuation-in-part of Ser. No. 122,527, Feb. 19, 1980, Pat. No. 4,291,815.

[51] Int. Cl.³ .................... B65D 7/28; B65D 6/40; B65D 39/00
[52] U.S. Cl. .................... 220/200; 29/588; 174/52 S; 174/52 FP; 252/514; 219/87
[58] Field of Search .............. 220/200, 359; 174/52 FP, 52 S, 54, 68.5; 29/588, 492, 613; 156/330; 219/87, 91; 252/514; 317/235; 228/234; 206/813, 328, 329

[56] References Cited

U.S. PATENT DOCUMENTS

| 3,874,549 | 4/1975 | Hascoe | 220/200 |
| 4,109,818 | 8/1978 | Hascoe et al. | 220/200 |
| 4,192,433 | 3/1980 | Hascoe | 220/200 |

Primary Examiner—George T. Hall
Attorney, Agent, or Firm—Amster, Rothstein & Engelberg

[57] ABSTRACT

A lid assembly includes an integral heat fusible layer defining a hermetic sealing area provided around the periphery of a lid for hermetic sealing semiconductor chips in a flat pack. The integral heat fusible layer includes a flowed solderable layer in the hermetic sealing area.

12 Claims, 3 Drawing Figures

LID ASSEMBLY FOR HERMETIC SEALING OF A SEMICONDUCTOR CHIP

This application is a continuation-in-part of co-pending application No. 122,527 filed Feb. 19, 1980; now U.S. Pat. No. 4,291,815.

BACKGROUND OF THE INVENTION

This invention relates in general to hermetic sealing of semiconductor chips, and more particularly, to a lid assembly having a selectively deposited integral heat fusible layer for hermetic sealing of a package containing a semiconductor chip.

Integrated circuits in the form of one or more semiconductor chips are assembled for utilization in small packages of various sizes generally known as flat packs. The flat pack encloses the semiconductor chip for protection of the various components therein to prevent damage from handling as well as atmospheric and other destructive conditions. The flat pack is formed of a package having a central opening on one major surface. The semiconductor chip is placed within a cavity of the flat pack defined by the central opening and is connected electrically by leads extending through the walls of the package. It has become conventional to provide a hermetically sealed cover over the central opening to protect the semiconductor chip.

Heretofore, it has been the practice to hermetically seal the semiconductor chip within the cavity of the flat pack by placing a preformed ring of heat fusible material, such as gold-tin eutectic solder, on the sealing area of the package surrounding the cavity, and overlying the central opening with a gold plated Kovar lid. Upon heating the thus formed assembly, the gold-tin eutectic solder forms a hermetic seal between the package and the gold plated lid.

The solder materials of the preforms are generally brittle and their dimensions are so small that the preforms are very fragile and extremely difficult to handle during assembly. Because of the difficulty of handling such preforms, it has also been difficult to insure accurate registration between the preform, the peripheral region of the lid and the sealing area surrounding the cavity of the package. As a consequence, there has been a substantial yield loss in the assembled flat packs due to defects in the hermetic seal. In addition, with the price of gold increasing to unforeseen limits, there is a real economic need to minimize or completely eliminate the use of gold in providing a hermetically sealed flat pack.

One hermetic sealing technique which partially overcomes the above-noted disadvantages is described in U.S. Pat. No. 3,874,549. In general, a gold plated Kovar lid for hermetic sealing of the package is superimposed with a heat fusible preform. The precise registration between the preform and the lid is achieved by spot welding the preform at a plurality of space locations about the peripheral area of the lid.

However, the welding of the preform to the lid greatly increases the risk of trapping dirt and dust therebetween which ultimately causes leaks in the hermetic seal. Visual inspection of the welded preform to the lid will not give any indication of the subsequent quality of the hermetic seal. Accordingly, defects in the hermetic seal are not noticed until the flat pack assembly is fully fabricated, resulting in an additional loss in yield. As these lids with welded preforms are commingled in automatic processing equipment, there is a tendency for the corners of the preforms to lift up and break off, further reducing the overall yield and quality of the hermetic seal.

Thus, there is heretofore an unsolved need to provide a lid for use in hermetically sealing semiconductor devices which overcomes the above-noted disadvantages resulting in the use of known lids and hermetic sealing techniques.

SUMMARY OF THE INVENTION

It is broadly an object of this invention to provide a lid assembly for hermetic sealing of a semiconductor chip which overcomes or avoids one or more of the foregoing disadvantages resulting from use of conventional lids. Specifically, it is within the contemplation of the present invention to provide a lid with an integral heat fusible layer disposed around the peripheral region of the lid in registration with a sealing area.

It is a further object of the present invention to provide a lid assembly for hermetic sealing of a semiconductor chip which eliminates or greatly reduces the utilization of gold as a material component.

It is still a further object of the present invention to provide a lid assembly having an integral heat fusible layer that eliminates the separate handling of fragile preforms used in hermetic sealing of semiconductor chips.

It is still a further object of the present invention to provide a lid assembly having an integral heat fusible layer applied by techniques that improve the registration of the heat fusible layer with the sealing area of the lid.

It is still a further object of the present invention to provide a lid assembly having an integral heat fusible layer which will maintain registration with the sealing area formed around the central opening of a flat pack during the hermetic sealing of a semiconductor chip.

It is still a further object of the present invention to provide a lid assembly having an integral heat fusible layer whose uniformity is an indication of the quality to be obtained in the hermetic seal.

In accordance with the present invention there is provided a lid for hermetic sealing of a package containing a semiconductor chip including a lid and an integral heat fusible layer deposited on the lid in a peripheral region defining a hermetic sealing area.

BRIEF DESCRIPTION OF THE DRAWINGS

The above brief description, as well as further objects, features and advantages of the present invention will be more fully understood by reference to the following detailed description of a presently preferred, nonetheless illustrative, lid assembly in accordance with the present invention when taken in conjunction with the accompanying drawings wherein.

DETAILED DESCRIPTION OF A PREFERRED EMBODIMENT

Figure 1:
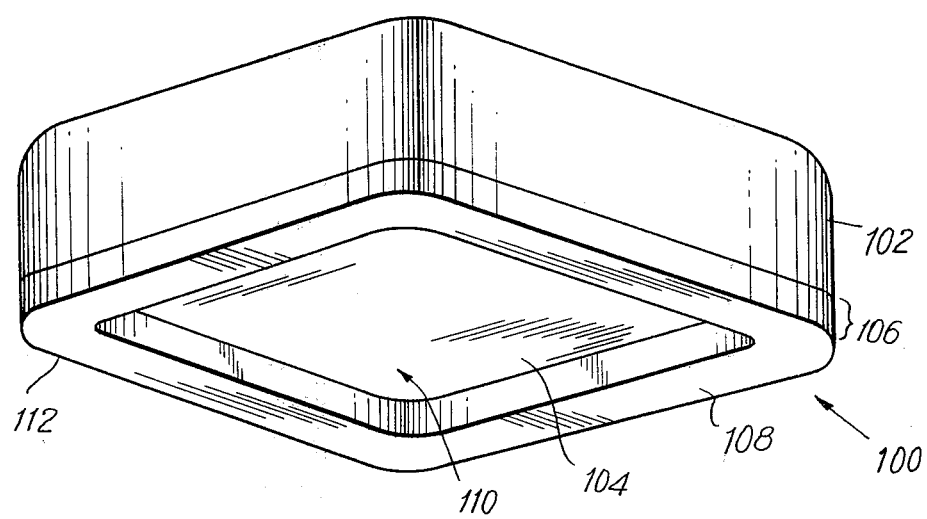
FIG. 1 is a perspective view of a lid assembly having an integral heat fusible layer for hermetic sealing of a semiconductor chip within a flat pack.

Referring specifically to the drawings, there is shown generally in FIG. 1 a lid assembly 100 including lid 102.

The lid 102 has at least one planar surface 104. Aligned around the periphery of the surface 104 is a solderable heat fusible layer 106. The solderable layer 106 is provided in the form of a ring. The term "ring" is used herein in its generic sense to include a closed loop of any configuration corresponding to the peripheral area of the lid 102, usually round or rectangular. Solderable layer 106 defines a hermetic sealing area 108 in the form of a ring having a central opening 110.

The lid 102 is of metal typically 0.010 inch thick. A preferred material for the lid is a cobalt-nickel-iron alloy, sold under the trademark KOVAR. In order to improve its corrosion resistance, the KOVAR lid is preferably plated with a corrosion-resistant metal, such as nickel. Such plating is typically 50–200 micro-inches in thickness. Alternatively, a nickel-clad Kovar lid or a pure nickel lid can be utilized.

The hermetic sealing of the flat pack is provided by the solderable layer 106 which can be in the form of a screen printable metallized paste or as a stamped preform of a soft solder alloy. Stamped preforms are commercially available from Consolidated Refining Company, New York, in a wide range of alloys having melting points generally below 450° centigrade. The stamped preforms are fabricated from alloys of lead, tin, bismuth, silver, antimony and zinc. A preferred composition of solderable layer 110 is an alloy of lead/tin/silver, 88%/10%/2% by weight, respectively. Selected compositions of the stamped preforms in the form of a screen printable metallized paste are commercially available from Alpha Metals and E. I. duPont.

In one embodiment, a Kovar lid is plated with approximately 100 micro-inches of nickel for corrosion-resistance. A two mil thick layer of a screen printable metallized solder paste of 88% lead, 10% tin and 2% silver is silk screened around the peripheral area of a surface 104 of 102 to provide the solderable layer. The silk screening operation is carried out according to well-known techniques such as those taught in "Thick Film Hybrid Microcircuit Technology", Donald W. Hamer and James. V. Biggers, Wiley-Interscience, a Division of John Wiley & Sons, Inc., New York Copyright 1972; and "Thick Films Technology and Chip Joining", Lewis F. Miller, Gordon and Breach Science Publishers, Inc., New York, Copyright 1972. The solderable layer is in the shape of a ring typically having a width of approximately 0.050 inches or less. The solder layer is then dried in a conventional manner.

The lid is then placed on a ceramic tray and passed through a multi-zone belt furnace having a hydrogen-nitrogen atmosphere in the ratio of 85/15, if the solder layer is fluxless or in a dry air atmosphere if the solder layer contains flux.

Figure 3:
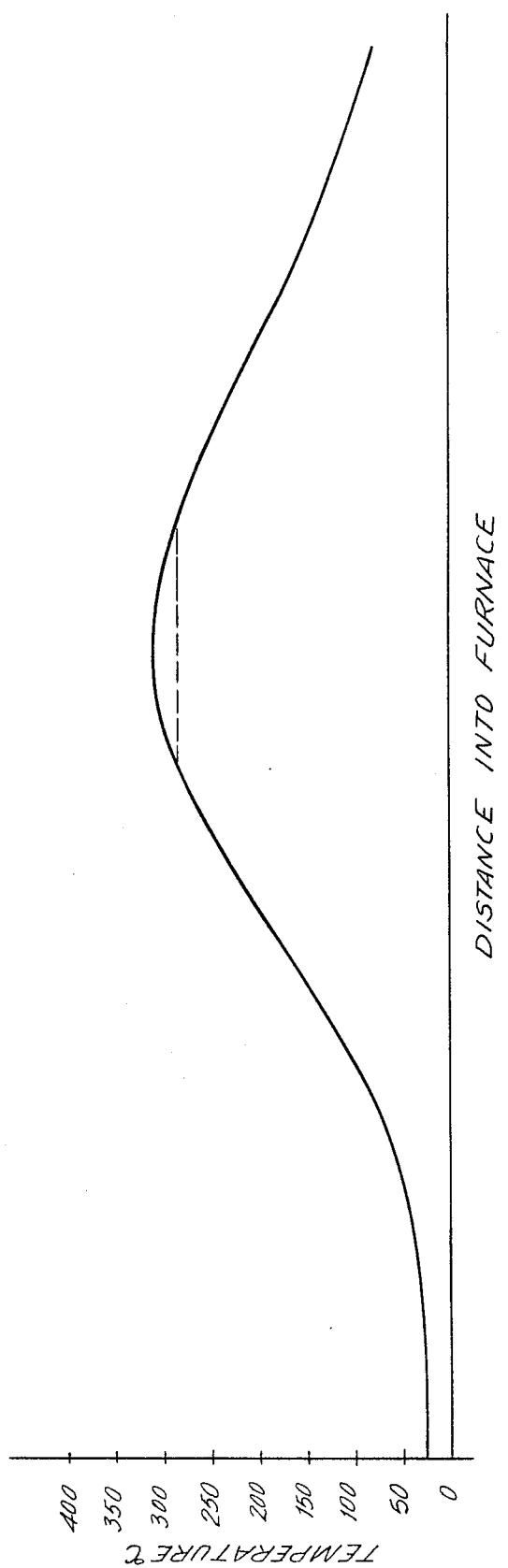
FIG. 3 is a melting profile for a lead/tin/silver alloy preform in a three-zone furnace.

The ceramic tray is transported through the multi-zoned furnace at a speed of 6 inches per minute. The furnace is constructed of three zones having independent temperature control. The first zone is set at 250° centigrade, the second zone at 375° centigrade, and the third zone at 200° centigrade. Optionally, a fourth zone may be used as a cooling chamber to cool the lid assembly 100 before exiting from the furnace. The actual temperature attained by the lid assembly 100 passing through the furnace is shown in the melting profile of FIG. 3.

The solder paste flows onto the lid 102 to form an integral heat fusible layer 112 in the hermetic sealing area 114 of the lid 102.

After cooling, the lid is cleaned in an ultrasonic tank with a xylene-isopropol alcohol bath. The lid is then tumbled with tumbling media and burnishing compound to brighten the nickel plating.

As thus described, the lid assembly 100 is provided with a integral heat fusible layer 112 which provides a hermetic sealing area 114. The lid assembly 100 eliminates the handling of fragile stamped preforms, provides for accurate registration of the integral heat fusible layer 112 with the lid 102 and the flat pack, eliminates the use of expensive gold as a material component, and provides for the visual inspection of the integral heat fusible layer to determine the quality of the subsequent hermetic seal.

Hermetically sealed flat packs according to the present invention have been found to surpass leak testing according to the procedures of Mil Spec. 883B. The hermetically sealed flat packs are placed in a helium atmosphere at 35–50 p.s.i. for two hours at room temperature. Using a helium leak detector, leak rates of less than $1 \times 10^{-8}$ were observed. Additional leak testing by placing the flat pack in cold freon, temperature cycling from $-65°$ centigrade to $+150°$ centigrade, placing the flat packs in a 24 hour bake at 150° centigrade, and storage testing for 168 hours all resulted in acceptable leak rates for flat packs hermetically sealed using lid assemblies according to the present invention.

Figure 2:
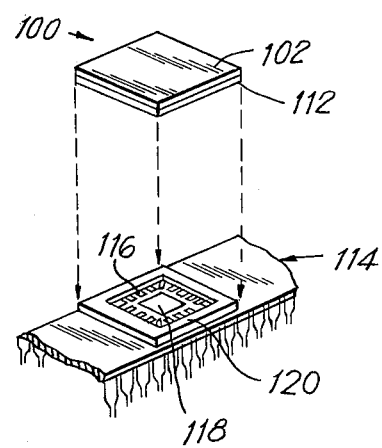
FIG. 2 is a perspective view of a lid assembly in registration with a semiconductive chip for hermetic sealing.

In FIG. 2, the method of hermetic sealing of lid assembly 100, fabricated according to the present invention, to the flat pack 114 having a cavity 116 in which is disposed a semiconductor chip 118, is shown. A flat pack 114 may be either of ceramic or metallic material; if ceramic, a conductive ring 120 is fused to the flat pack surrounding the cavity 116. The flat pack 114 and the lid assembly 100 in registration therewith, is passed through a suitable belt furnace for fusing the integral heat fusible layer 112 with ring 120 to hermetically seal the semiconductor chip 118 in the cavity 116.

Accordingly, by using the method and lid assembly according to the present invention for hermetic sealing of a semiconductor chip, the handling of fragile stamped preforms is avoided. Further, the method insures that the integral heat fusible layer 112 remains in registration with the peripheral area of the lid 102 and with the conductive ring 120 during the sealing operation.

Although the invention herein has been described with reference to a particular embodiment, it is to be understood that this embodiment is merely illustrative of the principles in application of the invention. Thus, it is to be understood that numerous modifications may be made in the illustrated embodiment and other arrangements may be devised without departing from the spirit and scope of the invention.

What is claimed is:

1. A lid assembly for hermetic sealing of a package containing a semiconductor chip comprising: a lid of metallic material including a single integral heat fusible layer deposited on said lid in a peripheral region defining a hermetic sealing area.

2. The lid assembly as set forth in claim 1 wherein said integral heat fusible layer includes a solderable heat fusible layer in registration therewith.

3. The lid assembly as set forth in claim 2 wherein said solderable layer is provided as a fired printed heat fusible layer.

4. The lid assembly as set forth in claim 2 wherein said solderable layer includes a preform of solderable alloy flowed thereto.

5. The lid assembly as set forth in claim 2 wherein said lid includes a corrosion inhibiting layer.

6. A lid assembly for hermetic sealing of a package containing a semiconnector chip comprising a metallic lid and a single solderable heat fusible layer deposited on said lid in a peripheral region defining a hermetic sealing area.

7. The lid assembly as set forth in claim 6 wherein said lid includes a corrosion inhibiting layer.

8. The lid assembly as set forth in claim 6 wherein said solderable layer includes a fired printed heat fusible layer or a heat fusible preform of solder alloy composition.

9. The lid assembly as set forth in claim 6 wherein said solderable layer is a composition of lead, tin and silver.

10. A method of fabricating a lid assembly for hermetic sealing of a package containing a semiconductor chip comprising the steps of depositing an integral heat fusible layer around the periphery of the surface of a lid to define a hermetic sealing area and flowing said integral heat fusible layer thereto.

11. The method as set forth in claim 10 wherein said depositing an integral heat fusible layer includes depositing a heat fusible preform of a solderable alloy around the periphery of the surface of said lid.

12. The method as set forth in claim 10 further including depositing a corrosion inhibiting layer on said lid prior to depositing said heat fusible layer.

* * * * *